(12) United States Patent
Marty et al.

(10) Patent No.: US 7,371,331 B2
(45) Date of Patent: May 13, 2008

(54) METHOD OF CREATING A PATTERNED MONOLAYER ON A SURFACE

(76) Inventors: Valerie J Marty, 3400 SW. Williamette Ave., Corvallis, OR (US) 97333; Tom Etheridge, 1715 NW. 17th St., Corvallis, OR (US) 97330

( * ) Notice: Subject to any disclaimer, the term of this patent is extended or adjusted under 35 U.S.C. 154(b) by 262 days.

(21) Appl. No.: 10/817,135

(22) Filed: Apr. 1, 2004

(65) Prior Publication Data

US 2005/0218112 A1 Oct. 6, 2005

(51) Int. Cl.
*B44C 1/22* (2006.01)
*C03C 15/00* (2006.01)
*C03C 25/68* (2006.01)
*C23F 1/00* (2006.01)

(52) U.S. Cl. .......................................... 216/54; 216/41
(58) Field of Classification Search ............... 156/230; 216/41, 54; 977/884–888
See application file for complete search history.

(56) References Cited

U.S. PATENT DOCUMENTS

| | | | | |
|---|---|---|---|---|
| 5,512,131 | A | * | 4/1996 | Kumar et al. ............... 438/738 |
| 5,578,351 | A | * | 11/1996 | Shashidhar et al. ........ 428/1.23 |
| 6,180,239 | B1 | * | 1/2001 | Whitesides et al. ....... 428/411.1 |
| 6,465,054 | B2 | * | 10/2002 | Effenberger ................ 427/553 |
| 6,562,398 | B1 | * | 5/2003 | Braach-Maksvytis et al. 427/58 |
| 2003/0024632 | A1 | * | 2/2003 | Hahn et al. ................. 156/230 |

* cited by examiner

*Primary Examiner*—Roberts Culbert (57) ABSTRACT

A method is provided for creating a patterned monolayer on a substrate. First, organic molecules are prepared that have self-assembling properties. These molecules are applied to an aligning substrate. Then, the aligning surface is applied to the substrate, then separated from the substrate, leaving ordered patterns of the organic molecules on the substrate.

28 Claims, 7 Drawing Sheets

METHOD OF CREATING A PATTERNED MONOLAYER ON A SURFACE

BACKGROUND

In recent years, innovation in the area of silicon integrated circuits has proved to be a major factor in the growth of the electronics industry. Current devices are of a scale on the order of tenths of micrometers. One goal of circuit designers is to further reduce the size of the chip space required for circuit components. Reducing the utilized chip space may reduce the amount of power required to operate the chip, may reduce the temperature of the circuit, and may allow the circuit to operate faster and more efficiently. Some solutions have been proposed to create silicon integrated circuits on the nanometer scale, but they all have limitations.

An extension of silicon processing has enabled microelectromechanical systems (MEMS) development. By incorporating deposition, etch and photo lithography processing, micron scale mechanical structures can be combined with electronic devices.

On the nanometer scale, there is much interest in creating structures to enable chemical and biological sensors, nanoelectronics and photonic devices. Some approaches to constructing nanometer scale structures include fine scale lithography, nanoimprint lithography, direct writing of device components, and the direct chemical synthesis and linking of components with covalent bonds. Each of these conventional approaches has their own drawbacks.

Fine scale lithography utilizes X-rays, electrons, ions, scanning probes, or stamping to define device components on a silicon integrated circuit. Device alignment is a major problem with fine scale lithography. The wafer on which the devices are built must be aligned to within a fraction of a nanometer in two or more dimensions. This level of control is extremely expensive to implement. E-beam lithography, a type of fine scale lithography, is capable of producing lines on small scale, but is limited in the size and range over which the lines can be written. The E-beam lithographic method also requires a high vacuum, which precludes the use of most organic materials in producing nanoscaled components. Additionally, E-beam lithography is slow and expensive, making it commercially impractical.

Another conventional method for producing lines is Nano Imprint Lithography ("NIL"). This method requires the use of molds. These molds are typically created by E-beam lithographic methods and require high pressure. Limitations exist with respect to mold release and defect replication.

The direct writing of the device components by electrons, ions, or scanning probes also has drawbacks. This is a serial process. Therefore, the direct writing of a wafer full of complex devices, each containing trillions of components, requires an extraordinary amount of time. This makes direct writing impractical to implement in large-scale commercial applications.

Another method is direct chemical synthesis and linking of components with covalent bonds. The problem with this method is that the only known chemical analogues of high information content circuits used have been proteins and DNA. Both of these chemical analogues have extremely complex and, to date, unpredictable secondary and tertiary structures that cause them to twist into helices, fold into sheets, and form other complex three-dimensional structures. The resulting topography is not useful for making nanoscale structures.

Therefore, a need exists for a method and system that can create well ordered nanoscale structures using commercially feasible processes.

BRIEF DESCRIPTION OF DRAWINGS

FIG. 8 is a flow chart illustrating a method of making a nanoscale component according to an embodiment of the invention; and.

DETAILED DESCRIPTION

Embodiments of the invention are directed to methods for creating well-ordered nanoscale features. Processes for creating nanoscale features are critical to enabling the development of nanoscaled integrated circuits. For example, features such as conductors and dielectrics can be developed on a substrate, as can other types of materials, such as gold, Au, nanoparticles could be conductors. Aligning organic molecules could be dielectrics used for certain components. As discussed above, the benefits of smaller scaled integrated circuits include faster processing times and lower temperatures when implemented in computing devices. It will be appreciated by those skilled in the art, however, that other embodiments of the invention may be implemented in applications where nanoscale features are useful, without departing from the spirit and scope of the invention, which is defined in the appended claims and their equivalents.

In one embodiment, self-assembling organic molecules are used to create nanoscaled features on an aligning substrate. The processes utilize the tendency of certain organic molecules to self-assemble into ordered patterns on certain substrates. The aligning substrate is made of a material that will facilitate self-assembly of organic molecules. Graphite, for example, would be an aligning substrate. It has a highly ordered crystal plane which adsorbs alkyl-cyano biphenyl molecules resulting in an ordered monolayer via self-assembly. This ordered layer is the foundation for building multiple structures on the nanoscale.

In one embodiment, the ordered layer formed on the aligning substrate would be used as an aligning surface to another species, either atomic, molecular or particulate. The species applied would preferentially align to a specific functional group. As such, multiple modifications of the surface could be performed resulting in multiple layers or chemical modifications of well-ordered structures defined by the initial layer formed on the aligning substrate.

In another embodiment, the ordered layer formed with or without modification on the aligning substrate is transferred to a target substrate. This self-assembled array may then be utilized as a mask. The material surrounding the mask may be etched to create nanoscale features in the masked areas.

According to an embodiment of the invention, the parameters of the nanoscale features can be controlled. For example, if the nanoscale features are wires: the length, width, height, distance apart, and number of wires may be controlled by the use of different process steps and process components. The desired parameters of the nanoscaled wires are, in part, a function of the composition of the organic molecules. Embodiments of the invention provide means to allow a designer to vary the parameters of certain circuit components on a nanoscale. Therefore, the composition of the organic molecule is a design choice made based on the desired parameters of the final product.

Figure 1:
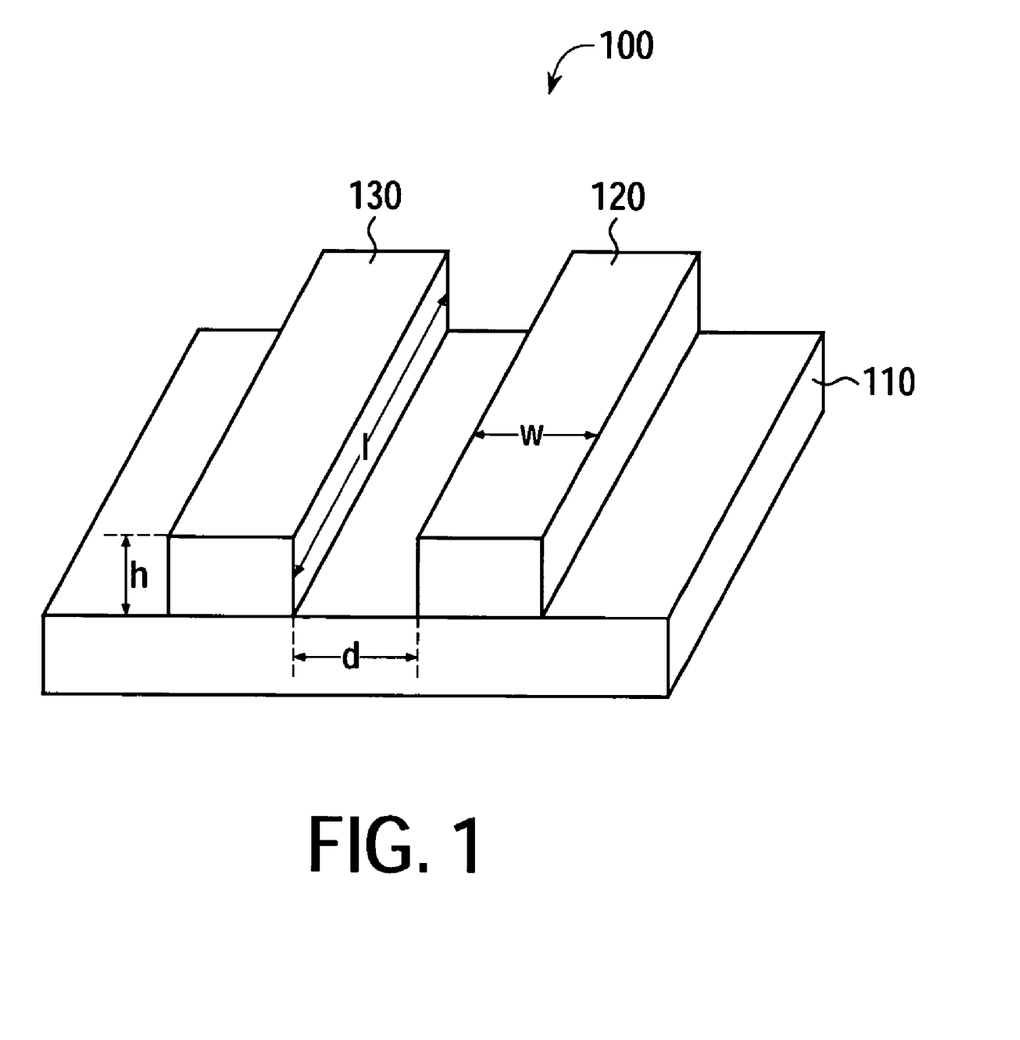
FIG. 1 is an illustration of a nanoscale component made according to an embodiment of the invention.

Referring to FIG. 1, one example of a resulting component having nanoscaled features is provided. The component 100 comprises a substrate 110 with lines 120, 130 positioned on the substrate's 110 surface. If used as electrical lines these structures 120, 130 would be made of metal. These structures could be made of other materials depending on the application. The structures 120, 130 are defined by a height, h, a width, w, and a length, 1, and are separated by a space d. According to an embodiment of the invention, subnanoscale dimensions and position of the structures can be controlled. These dimensions and positions may vary in practice. However, according to an embodiment of the invention, the structures created can be substantially straight and parallel, and will also be of a consistent width and height.

At the beginning of the process, the organic molecules, having head groups and tail groups, may be prepared in a solution. The organic molecule is then introduced to the aligning substrate in solution or via other transport mechanisms. The molecules could also be introduced by liquid injection, or other transport mechanisms are possible.

When the organic molecules come into contact with the aligning substrate, the organic molecules spontaneously self assemble, forming monolayer arrays. The monolayer arrays form a highly ordered pattern, as the organic molecules line up in pairs with head groups pairing with other head groups, and tail groups pairing with other tail groups to form parallel rows. The term "highly ordered" is a relative term indicating a periodic pattern created by the self-assembled molecules. According to an embodiment of the invention, the distance between parallel rows of paired organic molecules can be controlled based on the selection of the organic molecules and process solutions. The graphite lattice constrains the head spacing. The chain and functional group can provide added steric forces, which may affect which sites the head groups adsorb. The choice of head group would also affect spacing of molecules. The result is an array of organic molecules having pairs of head groups that are lined up by their head groups and separated by their tails in a substantially straight and parallel manner. Weak Van der Waals forces bind the organic molecules to the substrate.

This ordered array of molecules may then be used in two distinct ways. First, the surface of the aligning substrate that holds the self-assembled monolayers of organic molecules is treated with molecules or particles that preferentially interact with the head groups of the ordered array on the aligning substrate. These interacting molecules or particles may be delivered in the gas, liquid or solution phase. The molecules or particles are allowed to remain in contact with the self-assembled monolayers of organic molecules until a secondary array is created. In this way, an ordered array of molecules or particles with desired electrical, chemical or material properties can be created from molecules or particles that would not otherwise have assembled into a nanoscale array. Alternatively, the surface of the aligning substrate that contains the self-assembled monolayers of organic molecules is brought into direct contact with the target substrate. To assure adequate contact between the aligning substrate and the target substrate surface, slight pressure may be applied. The composition of the organic molecule is chosen such that one end of each organic molecule will be strongly attracted to the material composing the target substrate surface. This end anchors the organic molecule to the target substrate. When the organic molecules contact the target substrate, the anchors attach to the surface of the target substrate. When the aligning substrate is removed from the target substrate, the anchors of the organic molecules remain attached to the target substrate. The rest of the composition of the organic molecule is chosen such that it will not be attracted to the target substrate, and only weakly attracted to the aligning substrate. Therefore, when the aligning substrate is removed from the target substrate, the portion beyond the anchor end of the organic molecule detaches from the aligning substrate and then stands up and away from the target substrate surface. Anchored to the target substrate at one end, each organic molecule forms a substantially perpendicular line on the target substrate's surface.

In addition, other layers may be optimally added. Multiple layers may be layered upon each other to provide different characteristics, different layers, different structures and different textures to the device being created. The processes described herein and equivalent processes can be performed on multiple layers according to embodiments of the invention.

A narrow space exists between each pair of anchor ends. A relatively wider space exists between neighboring non-paired anchor ends. The wider spaces are revealed as the organic molecules stand up. In practice, the choice of different compositions of organic molecules can be used to predictably control and create the spacing between the rows of organic molecules. The spaces between the non-paired anchor ends will be a function of the length of the organic molecules.

The organic molecules standing up on the target substrate can be used in a nanoscale circuit as a dielectric. Alternatively, the areas of the target substrate that are not covered by the organic molecules may be etched away, leaving rows of nanoscaled material on the target substrate. As a further step, the organic molecules attached to the nanoscaled material may be removed with an appropriate solvent or etch. If the substrate has a layer of conductive material such as gold, nanoscaled wires can be formed on the target substrate. Thus, nanoscaled wires can be formed accordingly, and their parameters and orientation can be controlled using this method.

A method for creating a circuit, such as that shown in FIG. 1, utilizes an organic molecule that has a tendency to self-assemble into ordered patterns. In one embodiment, after the self-assembly occurs, ordered rows of organic molecules are created on a substrate surface and can be used as an etch mask. In another embodiment, the ordered rows of organic molecules can be used as a dielectric circuit component. As discussed below, the head group is made up of a subgroup and optionally a functional group. The tail group is composed of an alkyl chain having one end attached to the head group, and the other end extending away from the head group. The length of the tail will determine the distance between one row of self-assembled head group pairs and another row of self-assembled head group pairs.

Figure 2A:
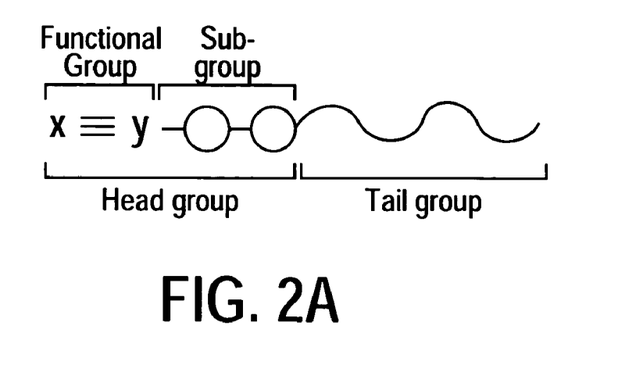
FIG. 2a is an illustration of an organic molecule for use in a method of making a nanoscale component according to an embodiment of the invention.

Generally, an embodiment of the invention is directed to molecules that have a tendency to self-align under certain circumstances. Referring to FIG. 2a, a general block diagram of a functional group and corresponding sub-group that make up the head group and a tail group are illustrated. Some molecules have a tendency to line up, where the head groups line up with the head groups, and the tail groups line up with the tail groups. In one embodiment, the organic molecule used is an alkyl-cyanobiphenyl liquid crystal. Alkyl-cyanobiphenyls are organic molecules. Alkyl-cyanobiphenyl liquid crystals adopt the generic structure represented in FIG. 2b. Embodiments of the invention are not limited to the use of substituted biphenyls, but extends to other molecules that have graphite-like subgroups, such as phenanthrenes, 1,6-diphenylbenzene, and other similar molecules. Such molecules have a tendency to self assemble into highly ordered patterns on a graphite surface, such as a HOPG surface. An alkyl-cyanobiphenyl has two organic subgroups, the cyano biphenyl and an alkyl chain. The biphenyl is a graphite-like subgroup that is part of the head of the molecule. Graphite-like can include any molecular group having $sp^2$ hybridization that resembles a fragment of a graphite sheet. Aromatic rings are an example of $sp^2$ hybridization useful in the practice of embodiments of the invention. The alkyl is a straight chain saturated hydrocarbon that defines the tail group of the molecule. The alkyl references an undefined alkane (single bonded carbon atoms) chain length. For example, a "hexyl" prefix of an alkyl indicates six atoms in the chain length, "octyl" defines eight, "decyl" defines ten, etc. Again, according to embodiments of the invention, the solution and the length of the chain, or the tail group, determines the distance between the self-assembled organic molecules.

Figure 2B:
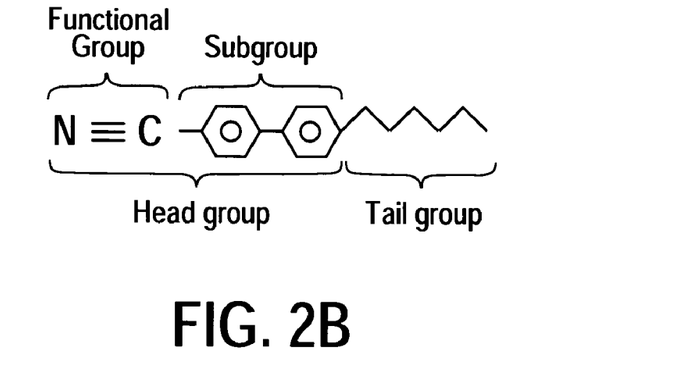
FIG. 2b is an illustration of an organic molecule for use in a method of making a nanoscale component according to an embodiment of the invention.

An embodiment of the invention is directed to the self-assembly of the molecules at the surface of the aligning substrate. Though the embodiment being described in FIG. 2 refers to an alkyl-cyanobiphenyl liquid crystal, not all embodiments will display liquid crystalline properties. Other organic molecules that have graphite-like subgroups, for example, would behave in the same manner. The biphenyl subgroup is illustrated and described as one embodiment. This invention is not limited to any particular graphite-like subgroup. In other embodiments, molecular groups having $sp^2$ bond hybridization will have graphite-like properties and can be useful substitutions for the alkyl-cyanobiphenyl liquid crystal.

"Cyano" refers to the CN functional group on the biphenyl subgroup. This cyano functional group may be substituted with another functional group based on the functional group's attractive properties. According to embodiments of the invention, different functional groups are attracted to different materials. In this embodiment, a thiol functional group is substituted for the cyano functional group. Thiol references a class of materials that incorporate a thiol functional group with one sulfur atom. The thiol is used to cause the organic molecule to be attracted to gold. Another example of a functional group that could be substituted for the cyano is isocynate. Isocynate is attracted to platinum and palladium. Other examples of functional groups include amines, isonitriles, and other similar groups.

Figure 3:
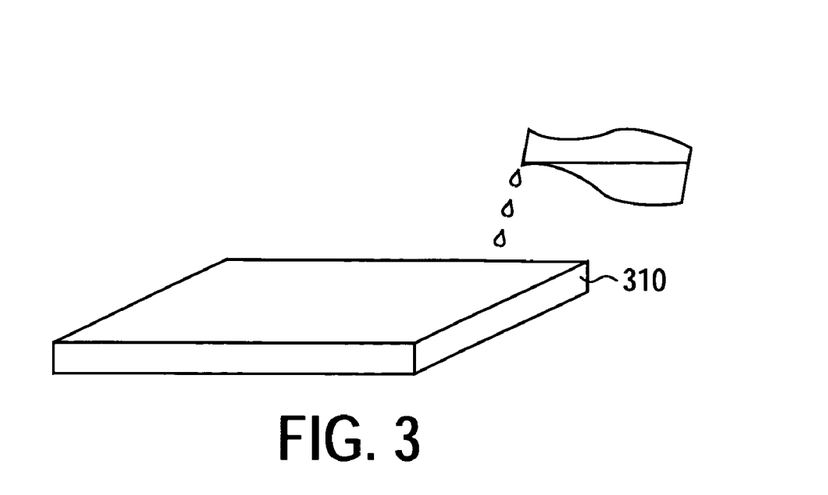
FIG. 3 is an illustration of the application of a solution for use in a method of making a nanoscale component according to an embodiment of the invention.

Referring to FIG. 3, a solvated preparation of the substituted alkyl-cyanobiphenyl is applied onto an aligning substrate 310. The aligning substrate 310 contains highly ordered pyrolytic graphite (HOPG). This process could also be performed by other methods, including liquid injection, precursors in a gas phase, and other known methods. This embodiment utilizes the tendency of alkyl-cyanobiphenyl liquid crystals to self-assemble into ordered patterns of biphenyl molecules when applied to HOPG. When applied to the HOPG surface, or the aligning substrate surface, the self-assembled molecules align on the surface. Embodiments of the invention employ this tendency of the self-assembling molecules to align into ordered patterns on the surface of the aligning substrate. The method may further include a solvent system used to create the solution of organic molecules. The surface shown is substantially planar, but may also be non-planar, flexible, or of other orientations depending on the application.

Figure 4:
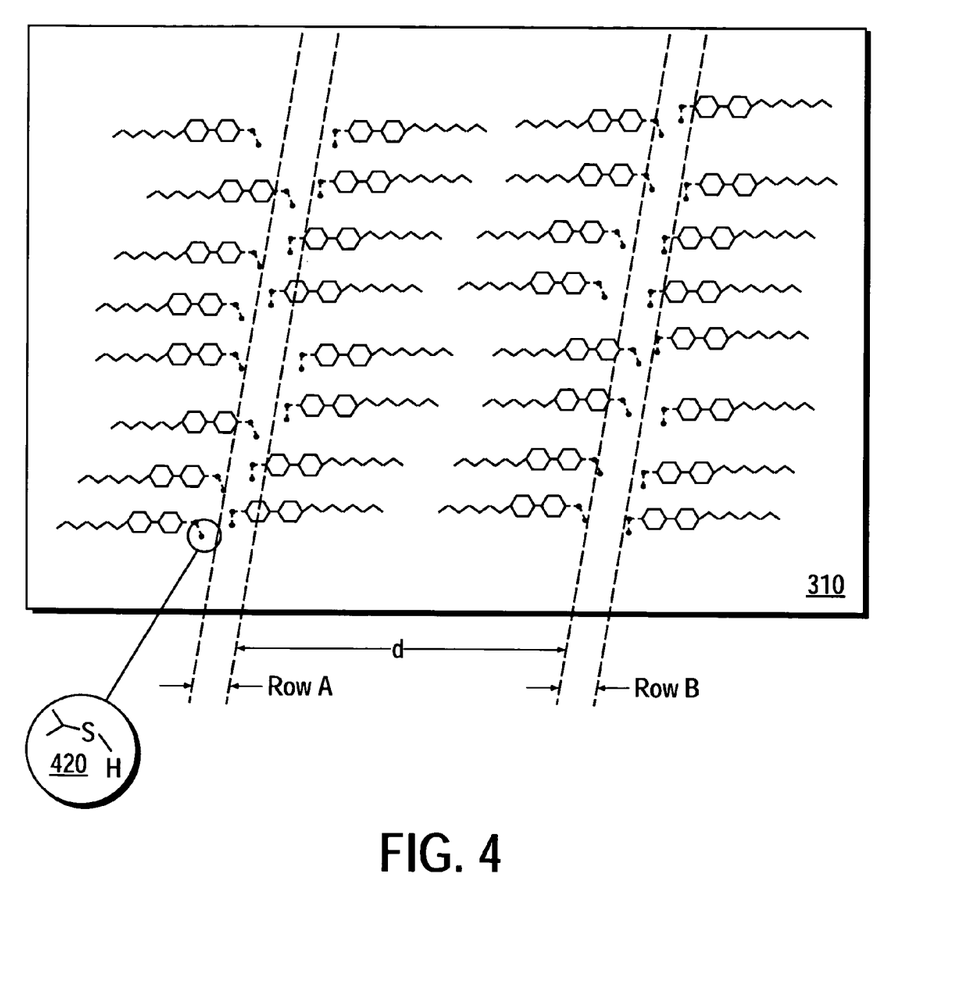
FIG. 4 is an illustration of an aligning substrate surface with a monolayer of self-assembled organic molecules for use in a method of making a nanoscale component according to an embodiment of the invention.

Referring to FIG. 4, after the substituted alkyl-cyanobiphenyl solution comes into contact with the aligning substrate 310 the alkyl-cyanobiphenyl solution self-assembles into organic monolayers. The self-assembly occurs rapidly, in a matter of seconds. The pattern formed is seen on the surface of the aligning substrate 310. The self-assembled organic molecules form an ordered pattern where they line up, in pairs and form parallel rows, A, B, having space d between them. The number and lengths of rows formed will be limited by the size of the aligning substrate, and could continue almost indefinitely. Thus, this parameter can be controlled as well.

Biphenyl rings of the molecules align themselves over similar structures in the graphite layer. The organic molecules bind to the aligning substrate surface through weak Van der Waals forces. The functional groups 420, show where the ends have been functionalized with thiol (i.e., contain a thiol functional group).

As illustrated in FIG. 4, the head groups align with other head groups to form substantially uniform and highly ordered rows, A, B, where the head groups pair-up with each other. The tail groups pair up similarly to define lateral space d, located between the rows. According to an embodiment of the invention, the width of each row may be predetermined according to the head group chosen. In addition, the lateral space d between the rows can be predetermined by selecting a solution that will form tail groups according to the desired space. In another embodiment, the lateral spacing d can be further modified by solvating the self-assembling molecules in an alkane solvent. The alignment surface shown is substantially planar, but may also be non-planar, flexible, or of other orientations depending on the application.

Figure 5:
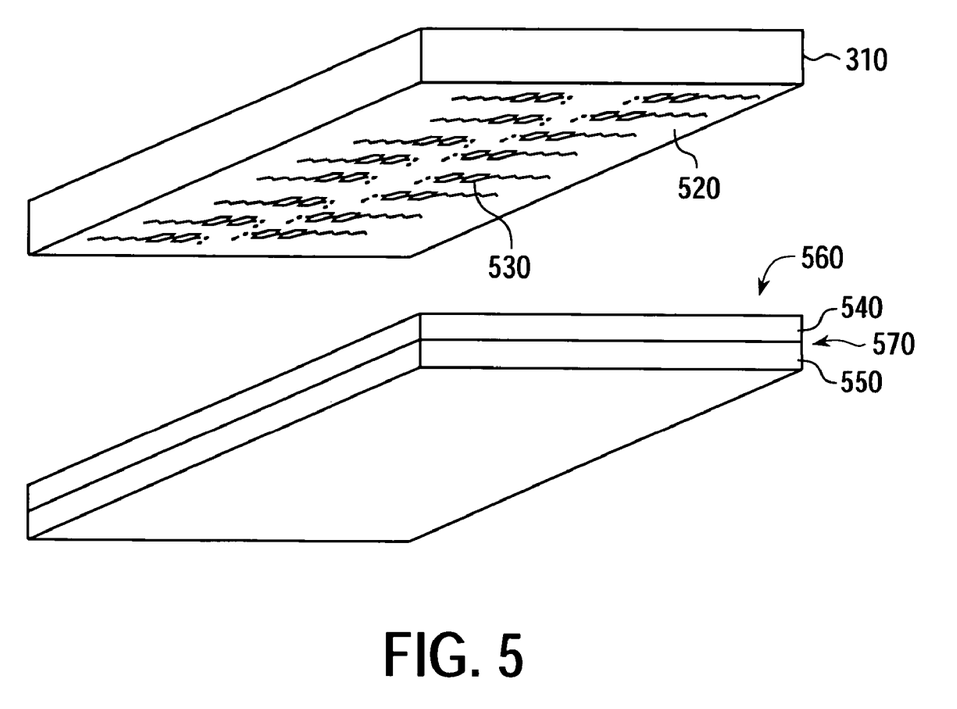
FIG. 5 is an illustration of an aligning substrate surface with the monolayer of organic molecules being applied to a target substrate for use in a method of making a nanoscale component according to an embodiment of the invention.

Referring to FIG. 5, the next step is shown after the self-assembling has taken place on the aligning substrate 310. The side 520 of the aligning substrate 510 that contains the self-assembled organic molecules 530 is brought into direct contact with the target substrate 570. Target substrate 570 is shown with two layers, a metal layer 540 over a base layer 550. An example of such a configuration is a gold layer on top of silicon, which may later be etched to form wires according to an embodiment of the invention.

The target substrate and aligning surface shown in FIG. 5 is substantially planar. However, in other embodiments, either could be non-planar or even flexible. According to an embodiment of the invention, arrays may be aligned on a non-planar or flexible surface, then applied to a substrate. Likewise, the substrate could be planar, non-planar, flexible or other orientation. Such substrates can be accommodated for applying the alignment surface to the substrate surface to apply arrays of components on the substrate surface.

Slight pressure may be applied to assure adequate contact between the aligning substrate 510 and the target substrate 570. In other embodiments, materials such as palladium or platinum may also be used for a target substrate surface in place of gold. The choice of different target substrate surfaces would require alternative functional groups to facilitate the attachment of the self-assembled molecules.

In this embodiment, each head of the organic molecules would contain a thiol functional group providing a strong attraction to gold. Therefore, the functional group of the head groups will be strongly attracted to the target substrate surface 560 when brought into contact with the target substrate 570. As another example, if platinum or palladium were the desired target substrate surface, an isocynate could be used as a functional group. Other functional groups that may be used include cyanides, cyanates, isocyanides and other similar functional groups. The functional groups are chosen based on their ability to to attach to the target substrate surface after the self-assembly of the molecules.

Figure 6:
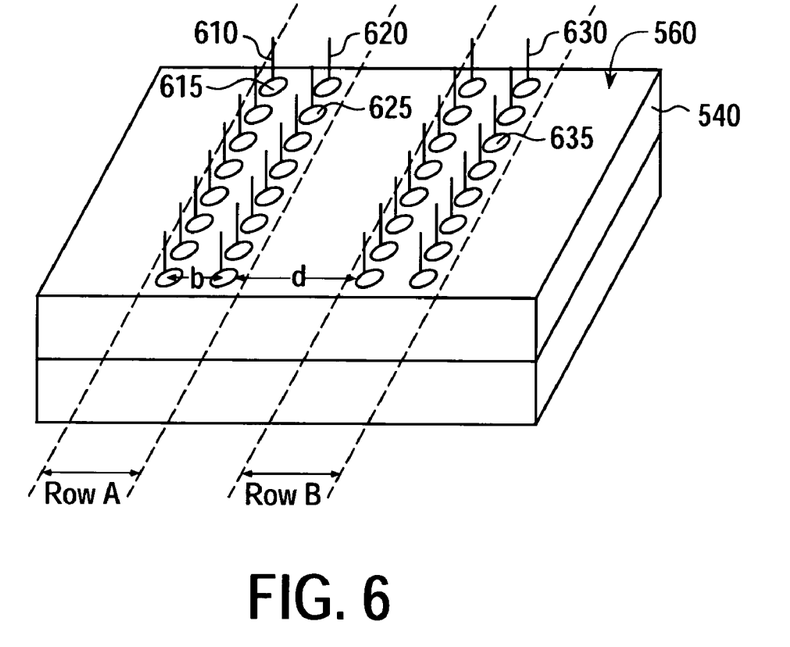
FIG. 6 is an illustration of a target substrate having a highly ordered pattern of organic molecules on its surface for use in a method of making a nanoscale component according to an embodiment of the invention.

In FIG. 6, the target substrate surface 560 is shown after the aligning substrate 310 has been removed. Examining one of the organic molecules, the functional group 625 of the head group remains attached to the target substrate surface 560, while the biphenyl/alkyl end 610 of the molecule stands up from the substrate surface 560. When the biphenyl/alkyl ends stand up, the organic molecules form substantially perpendicular lines directed away from the target substrate surface 560. A wider space d occurs where the tail groups were aligned on the target substrate surface 560, defining the distance between functional group 615 and functional group 635. A relatively narrow space b occurs where the functional groups of head groups align in pairs with functional groups of other head groups. For example, the narrow space b defines the distance between the functional group 615 and functional group 625. In practice, the space b will be small in comparison to the wider space d. Also, the proportions illustrated in FIG. 6 and other related figures are not necessarily representative of actual proportions in practical applications. For example, the space b may be smaller than shown, as the functional group pairs are more tightly packed in practice. According to an embodiment of the invention, the choice of different lengths of alkyl chains and solvents can be used to predictably control the spacing of the organic molecules in the self-assembled monolayer arrays. The alkyl chains provide steric separation of the head groups. By increasing the length of the alkyl chain, the space d can be increased. In practice, more layers could be added to the surface 560 to create further three-dimensional structures or more complex patterns on the component.

Figure 7:
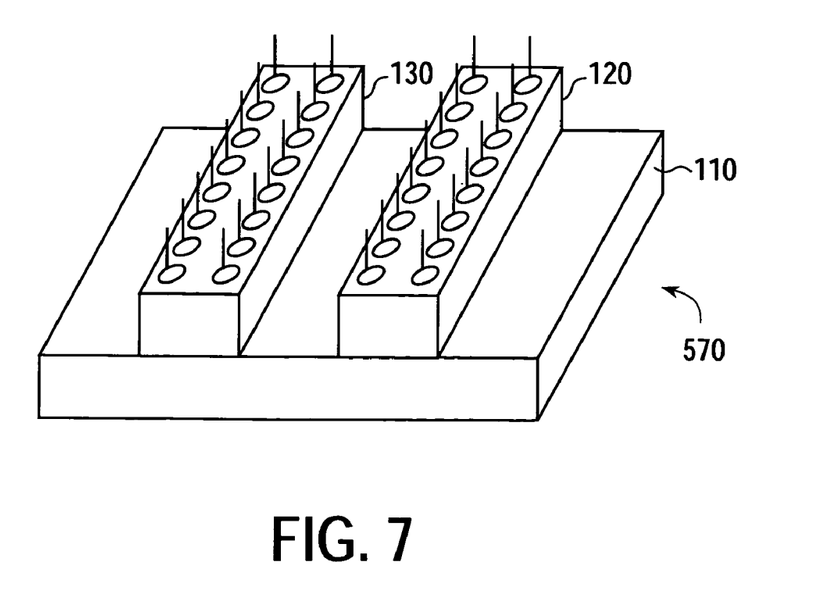
FIG. 7 is an illustration of a target substrate having highly ordered pattern of organic molecules on its surface and having substrate etched away to make a nanoscale component according to an embodiment of the invention.

As seen in FIG. 7, the areas of the target substrate 560 that are not covered by the organic molecules may be etched away, leaving two lines 120, 130 on the base layer of the target substrate 570. The two lines 120, 130 have organic molecules attached. The organic molecules shown in FIG. 7 attached to the two lines 120, 130 may be etched off providing the component 100 shown in FIG. 1. In another embodiment, the self-assembled monolayers can be used as seen in FIG. 6 as an ordered dielectric array atop the target substrate. Thus, according to an embodiment of the invention, nanoscale circuit materials and components can be formed and their size and orientation can be substantially controlled. In practice, more layers could be added to the component to create further three-dimensional structures on the component.

If the organic molecules are used as a mesh to make circuit wires (such as mesh over a gold substrate layer formed over a base substrate, silicon, etc. . . . ), for example, the width of the rows would define the width of the resulting wires after the material occurring in the space d, is etched away. The space d, would define the space between the wires. As another example, the organic molecules may be used as a dielectric circuit component, an array of dielectric lines. Such dielectric lines would have a width that is equal to the width of the row A or B, for example, separated by space d.

Figure 8:
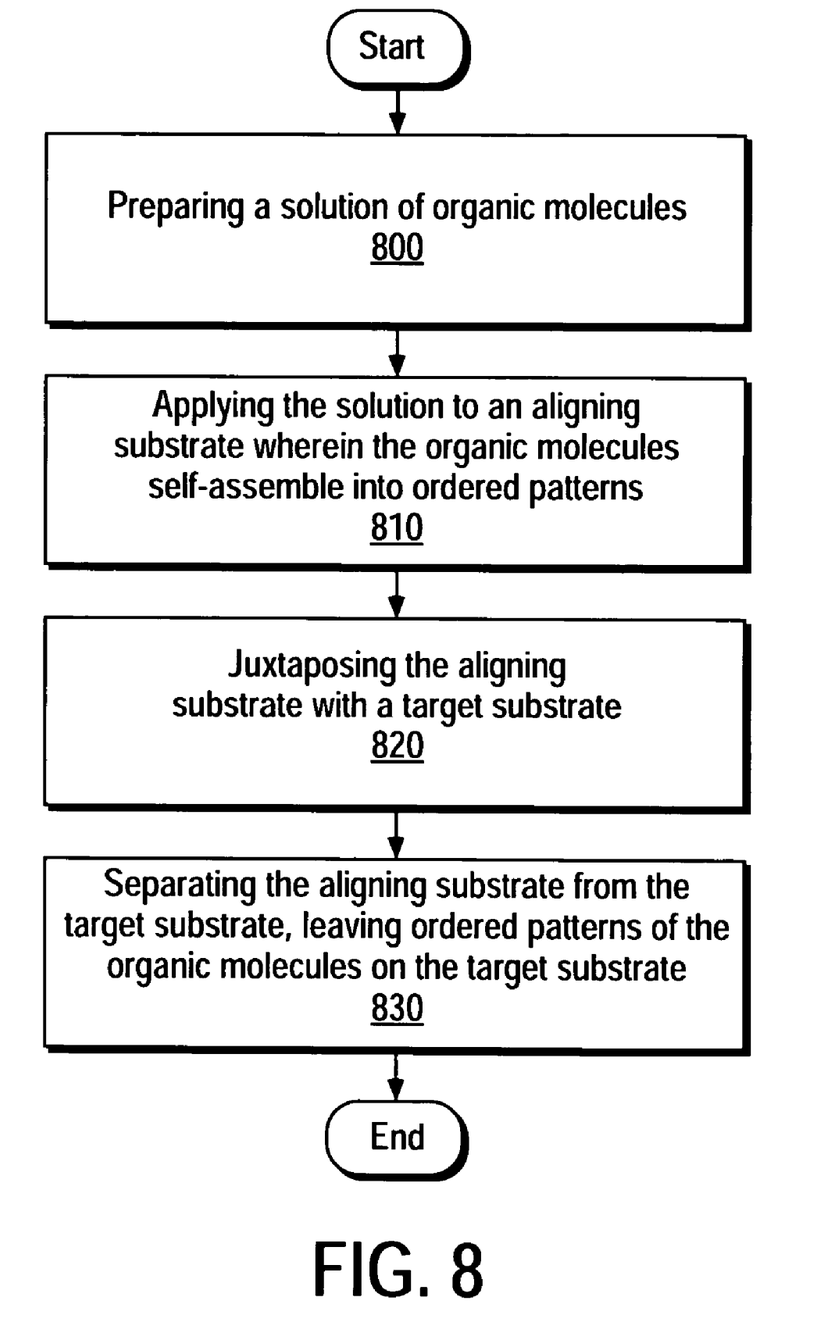

Referring to FIG. 8, one process embodying the invention is illustrated. Though this process is described in the order of the steps illustrated in FIG. 8, the invention is not limited to the order of these steps. At the Start of the process, a solution of organic molecules is prepared in Step 800. As discussed above, a sample of an organic molecule that has a tendency to self-assemble into ordered patterns is prepared. In one embodiment, the organic molecule used is an alkyl-cyanobiphenyl liquid crystals. The invention is not limited to the use of alkyl-cyanobiphenyls, but extends to molecules that have a tendency to self assemble on an appropriately accommodating surface. Examples are those that have graphite-like subgroups that have a tendency to self assemble on a graphite surface, such as a HOPG surface. Some examples of subgroups include phenanthrenes, 1,6-diphenylbenzene, and may include others.

As discussed above, in one embodiment, a thiol functional group may be substituted for the cyano functional group in step 800. The thiol is used to cause the organic molecule to be attracted to gold. Thiol references a class of materials that incorporate a thiol functional group with one sulfur atom. Another example of a functional group that could be substituted for the cyano is isocynate. Isocynate references a class of material that incorporates an isocynate functional group. Isocynate is attracted to platinum and palladium.

Next, in Step 810, a solution is applied to an aligning substrate, wherein the organic molecules naturally self-assemble into ordered patterns. As discussed above, after the substituted alkyl-cyanobiphenyl solution comes into contact with an aligning substrate, the alkyl-cyanobiphenyl liquid crystals self-assemble into organic monolayers. The self-assembly can occur rapidly, in a matter of seconds. An example of a pattern formed is seen in FIG. 4 on the surface of the aligning substrate 410. When the organic molecule solution self assembles on the aligning substrate, it forms monolayers composed of organic molecules. Self-assembled organic molecules form an ordered pattern. The ordered pattern is formed as the organic molecules line up in pairs and form parallel rows. The organic molecules bind to the aligning substrate surface through weak Van der Waals forces.

In Step 820, the aligning substrate is juxtaposed with a target substrate. As discussed above, the next step after the self-assembly has taken place is juxtaposing the aligning substrate with a target substrate. The side of the aligning substrate containing the self-assembled organic molecules is brought into direct contact with the target substrate. Slight pressure may be applied to ensure adequate contact between the aligning substrate and the target substrate. In an alternate embodiment, the surface of the target substrate is gold and the base layer is silicon. Each head group of the organic molecules contains a substituted thiol functional group that was chosen for its strong attraction to gold. Therefore, the functional groups of the head groups will become strongly attached to the target substrate surface when brought into contact with the target substrate. Materials such as palladium or platinum may be used for a target substrate surface in place of gold. The choice of different target substrate surfaces would require different functional groups to facilitate the attachment of the self-assembled molecules.

In Step 830, the aligning substrate is separated from the target substrate, leaving ordered patterns of the organic molecule on the substrate surface. In FIG. 6, the target substrate surface 560 is shown after the aligning substrate has been removed. Examining one of the organic molecules, the functional group 615 of the head group remains attached to the target substrate surface 560, while the biphenyl/alkyl end 610 of the molecule stands up from the target substrate surface 560. When the biphenyl/alkyl ends stand up, the organic molecules are directed away from the target substrate surface 560. In practice, the choice of different lengths of alkyl chains and solvents used in preparing the organic molecules can be used to predictably control the spacing between the organic molecules in the self-assembled monolayer arrays.

Figure 9:
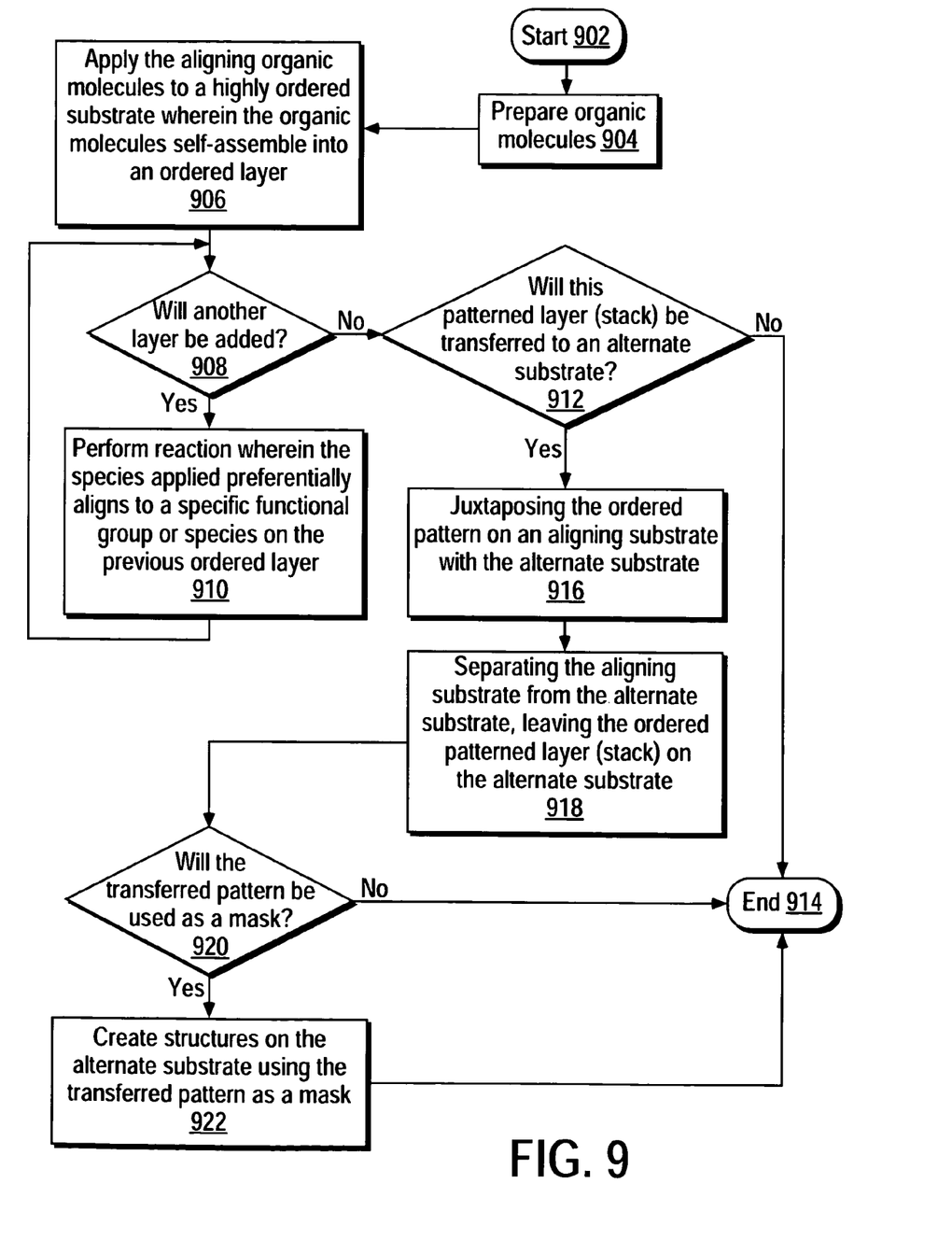
FIG. 9 is a flow chart illustrating a method of making a nanoscale component according to an embodiment of the invention.

Referring to FIG. 9, an alternate process is illustrated in a flow chart 900. The process begins at Step 902, and, in Step 904, organic molecules are prepared, such as certain organic molecules that have a tendency to naturally align under certain circumstances. In Step 906, the aligning organic molecules are applied to a substrate where they self-assemble into an ordered layer. In Step 908, it is determined whether an additional layer is to be added. As discussed above, multiple layers may be added upon one another according to an embodiment of the invention. If more are to be added, the process proceeds to Step 910, where the species are applied preferentially to a specific functional group, or a species in a previous ordered layer. The process loops back to Step 908, and can loop a number of times according to the number of layers desired. When no further layers are to be deposited, the process goes to Step 912, where it is determined whether the patterned layer, or possibly the stack, is to be transferred to an alternate substrate. If no, the process ends at Step 914. If yes, the process proceeds to Step 916, where the ordered pattern is juxtaposed on an aligning substrate with the alternate substrate. Then, in Step 918, the process of separating the aligning substrate from the alternate substrate is performed, leaving the ordered pattern, or patterns, of layers on the alternate substrate. Next, the process proceeds to Step 920, where it is determined whether the pattern would be used as a mask. If not, then the process ends at Step 914. If yes, then structures are created in Step 922 on the alternate substrate using the transferred pattern as a mask.

The resulting product from these processes can be used as is, to create an ordered dielectric array atop the target substrate, or it can be used as a mask layer to create a complimentary pattern on a target substrate. According to an embodiment of the invention, nanoscale circuit materials and components, metal lines and dielectric structures, can be formed accordingly, and their size and orientation can be controlled.

Embodiments of the invention have been described with reference to a method and apparatus for creating nanoscaled circuit components with monolayers made with self-assembling organic molecules. It will be appreciated by those skilled in the art, however, that the invention has broader utility. Other embodiments may be implemented according to the invention without departing from the spirit and scope of the invention, the scope of which is to be construed in accordance with the following claims and their equivalents.

The invention claimed is:

1. A method of creating a patterned monolayer on a substrate, comprising;
preparing organic molecules having head groups and tail groups;
applying the organic molecules to an aligning surface consisting of a planar surface;
allowing the organic molecules to self assemble, where the head groups pair with other head groups and the tail groups pair with other tail groups to form parallel rows in a plane parallel with the planar surface of the aligning surface;
contacting the aligning surface having the self assembled organic molecules with a substrate surface, where one end of each organic molecule becomes an anchor end attracted to the substrate surface and a portion beyond the anchor end is attracted to the aligning surface; and
separating the aligning surface from the substrate surface, where the portion beyond the anchor end transitions to extend generally along a direction that is perpendicular to the substrate surface and the anchor end is anchored to the substrate surface to create a space between each pair of anchor ends.

2. A method according to claim 1, wherein the aligning surface is graphite.

3. A method according to claim 1, wherein preparing includes preparing at least two different species of organic molecules to preferentially align to a specific feature on the aligning surface when applied.

4. A method according to claim 1, wherein preparing includes preparing at least two different species of the organic molecules to preferentially align to a plurality of features on the aligning surface when applied.

5. A method according to claim 1, further comprising utilizing the ordered patterns as a mask.

6. A method according to claim 1, wherein the aligning surface is highly ordered pyrolytic graphite.

7. A method according to claim 1, wherein each of the organic molecules have a functional group.

8. A method according to claim 7, wherein the head group is a molecular group.

9. A method according to claim 8, wherein the head group is a molecular group having an aromatic ring.

10. A method according to claim 7, wherein the head group is biphenyl.

11. A method according to claim 7, wherein the size of the tail group helps determine the space between each pair of anchor ends.

12. A method according to claim 11, wherein preparing the molecules comprises preparing a solvent system having organic molecules therein, and wherein the organic molecules used to prepare the solvent system determines the spacing.

13. A method according to claim 7, wherein the functional group of the organic molecules is chosen based on processing requirements.

14. A method according to claim 13, wherein the organic molecules each contain a biphenyl subgroup.

15. A method according to claim 13, wherein the organic molecules each contain a thiol group and wherein the substrate contains a layer of gold.

16. A method according to claim 13, wherein the organic molecules contains an isocynate group as the functional group, and the substrate contains a layer chosen from one of platinum and palladium.

17. A method according to claim 13, wherein the organic molecules contain an isocynate group as the functional group, and particles containing palladium preferentially align to the aligning surface along aligned molecules according to their functional groups, and wherein the substrate surface includes palladium.

18. A method according to claim 13, wherein the self assembled organic molecule contains an isocynate group as the functional group, and particles containing platinum preferentially align to the aligning surface along the ordered isocyanate functional groups.

19. A method according to claim 1, wherein each of the organic molecules have optionally a functional group, wherein the organic molecules are laterally spaced after they are applied.

20. A method according to claim 19, further comprising solvating the organic molecules in an alkane solvent, wherein the solvating process controls the lateral spacing of the organic molecules.

21. A method according to claim 19, wherein the organic molecules each comprise substituted alkyl biphenyl.

22. A method of creating a patterned feature on a substrate comprising:
   preparing a solution of organic molecules having head groups and tail groups;
   applying the solution to an aligning surface consisting of a planar surfaces, where the head groups pair with other head groups and tail groups pair with other tail groups to form parallel rows in a plane parallel with the planar surface of the aligning surface;
   contacting the aligning surface having the self assembled organic molecules with a substrate surface, where one end of each organic molecule becomes an anchor end attracted to the substrate surface and a portion beyond the anchor end is attracted to the aligning surface; and
   separating the aligning surface from the substrate surface, where the portion beyond the anchor end transitions to extend generally along a direction that is perpendicular to the substrate surface and the anchor end is anchored to the substrate surface to create a space between each pair of anchor ends.

23. A method according to claim 22, wherein separating the aligning surface from the substrate surface includes leaving ordered patterns of the organic molecules on the substrate in a manner to perform as a mask.

24. A method according to claim 22 further comprising introducing additional organic molecule species to the aligning surface which preferentially align to the functional groups existing along defined patterns.

25. A method according to claim 22, further comprising introducing additional organic molecule species having functional groups to the aligning surface to cause certain molecules to preferentially align according to functional groups along pre-defined patterns.

26. A method according to claim 23, wherein the method further comprises etching the substrate.

27. A method according to claim 24, wherein the method further comprises etching the substrate.

28. A method according to claim 22, further comprising controlling the lateral spacing of organic molecules by solvating the self-assembling molecules in an alkane solvent.

* * * * *

UNITED STATES PATENT AND TRADEMARK OFFICE
CERTIFICATE OF CORRECTION

| | |
|---|---|
| PATENT NO. | : 7,371,331 B2 |
| APPLICATION NO. | : 10/817135 |
| DATED | : May 13, 2008 |
| INVENTOR(S) | : Valerie J. Marty et al. |

It is certified that error appears in the above-identified patent and that said Letters Patent is hereby corrected as shown below:

In column 11, line 31, in Claim 22, delete "surfaces" and insert -- surface --, therefor.

Signed and Sealed this

Eleventh Day of November, 2008

JON W. DUDAS
*Director of the United States Patent and Trademark Office*